United States Patent [19]

Wilcox

[11] Patent Number: 5,017,816
[45] Date of Patent: May 21, 1991

[54] ADAPTIVE GATE DISCHARGE CIRCUIT FOR POWER FETS

[75] Inventor: Milton E. Wilcox, Saratoga, Calif.

[73] Assignee: National Semiconductor Corp., Santa Clara, Calif.

[21] Appl. No.: 433,366

[22] Filed: Nov. 8, 1989

[51] Int. Cl.$^5$ .................. H03K 17/60; H03K 3/01; H03K 3/26

[52] U.S. Cl. .................. 307/570; 307/570; 307/572; 307/575; 307/578; 307/581; 307/582; 307/264; 307/270

[58] Field of Search .................. 307/570–572, 307/575, 577–578, 581, 14 582, 264, 270

[56] References Cited

U.S. PATENT DOCUMENTS 4,430,586  2/1984  Hebenstreit .................. 307/578
4,481,434 11/1984  Janutka .................. 307/581

*Primary Examiner*—Stanley D. Miller
*Assistant Examiner*—Margaret R. Wambach
*Attorney, Agent, or Firm*—Limbach, Limbach & Sutton

[57] ABSTRACT

An adaptive gate discharge circuit for discharging the gate of a power FET transistor. The adaptive gate discharge circuit includes discharge driver circuitry which responds to the control signal by discharging the power FET gate from the initial "on" potential of the power FET to below a selected potential at which the power FET is turned off. During gate discharge, but prior to the potential of the power FET gate dropping below the selected potential, adaptive bias circuitry continues to operate to provide biasing current both to the discharge driver circuitry as well as to any other circuitry it may be biasing. However, when the potential of the power FET gate drops below the selected potential, low current biasing circuitry reduces the operating voltage of the adaptive biasing circuitry thereby turning off the adaptive biasing circuitry and any other circuitry it may be biasing.

4 Claims, 1 Drawing Sheet

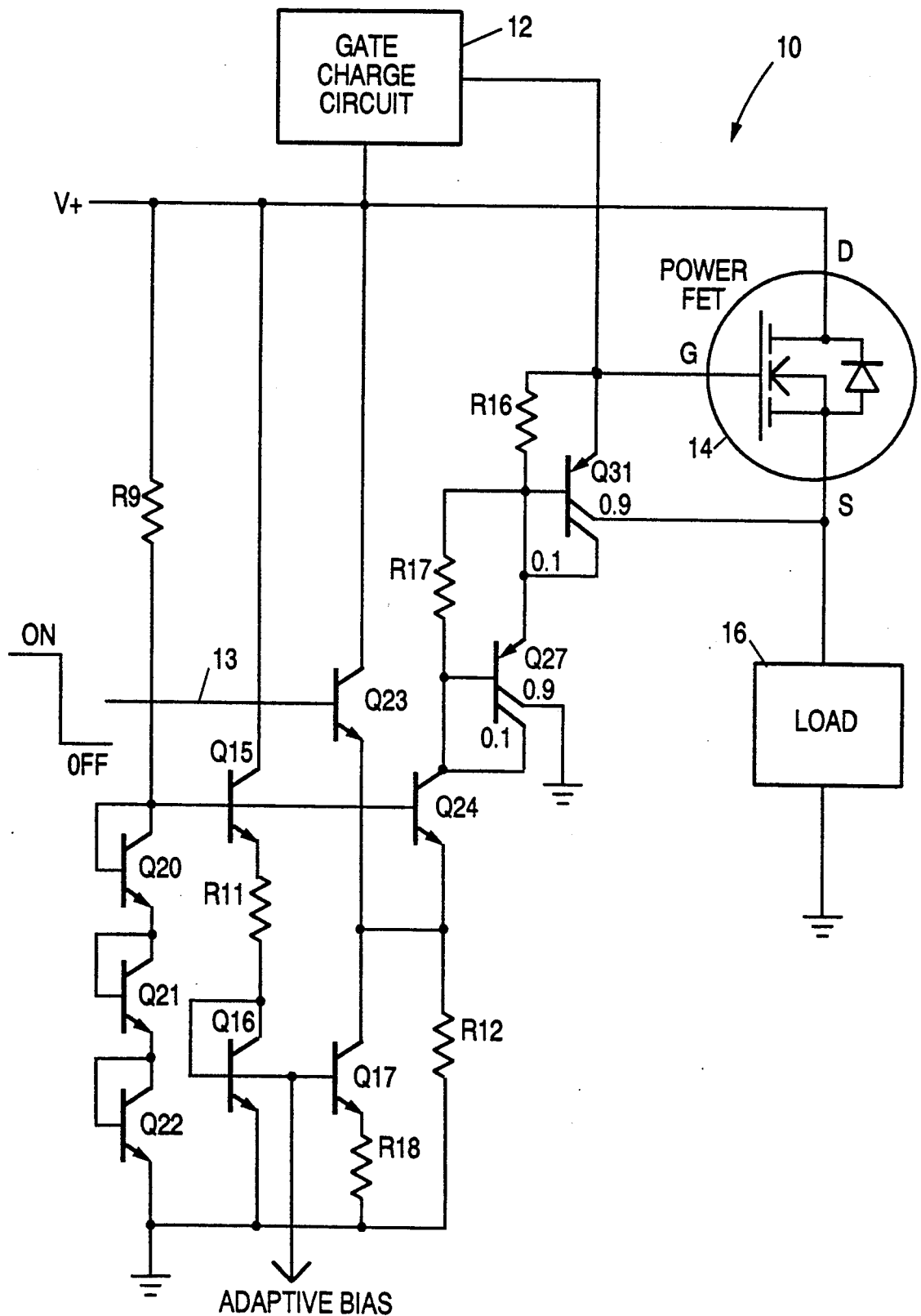

5,017,816

ADAPTIVE GATE DISCHARGE CIRCUIT FOR POWER FETS

BACKGROUND OF THE INVENTION

1. Field of the Invention

The present invention relates to electronic circuits and, in particular, to a power FET gate discharge circuit which remains active after all other circuitry is turned off to fully discharge the power FET gate and then turns itself off so that only a single low current path remains between supply and ground.

2. Discussion of the Prior Art

The gate impedance of a large power MOSFET transistor is highly capacitive. Hence, the terms "charge" and "discharge" are used to describe turning the power transistor on and off, respectively.

In all high-side driver applications (and in low-side drivers operating from low supply voltages), the gate of the power FET must be raised above the supply potential in order to turn the power FET on. This requires the use of charging circuitry which "pumps" the power FET gate above the supply to the desired potential. Typically, this charging circuitry is designed to maintain the desired potential on the power FET gate after the FET has been turned on while at the same time minimizing extraneous current drain.

Similarly, discharge circuitry is required to pull the gate of the power FET down to turn the FET off. Optimally, the discharge circuitry should conserve current when the power FET is off. For example, in automotive applications, it is required that some circuitry (e.g. clock, memory radio, etc.) remain powered even when the ignition is turned off; it is highly desirable in this application to provide power to these selected circuits while at the same time minimizing the current drain on the car battery.

Typically, MOS circuitry is utilized for implementing charging and discharging circuitry for power FETs because of the true on-off and high speed switching capability of MOS transistors.

However, a major deficiency of MOS switches is that, in some harsh operating environments, the low breakdown voltages of the MOS transistors are insufficient for the transistors to withstand high voltage transients. For example, in automotive systems, the possibility of inadvertent reverse battery conditions or loose battery cables has caused some automotive manufacturers to specify that integrated circuits (IC) utilized in these applications be capable of withstanding up to 60V, well above the breakdown voltage of commonly available MOS transistors. Thus, additional protective circuitry is required to shield the MOS switching transistors from voltage transients.

Discharging circuitry can be implemented utilizing bipolar transistors configured to withstand high voltage transients. However, substantial bias currents are typically required in order to maintain desired on/off switching speeds.

SUMMARY OF THE INVENTION

The present invention provides an adaptive gate discharge circuit for discharging the gate of a power FET transistor wherein the power FET gate is being held by a control signal at an initial potential sufficient to hold the power FET on. The adaptive gate discharge circuit includes discharge drive circuitry which discharges the power FET gate to below a selected potential when the control signal is turned off. During gate discharge, adaptive bias circuitry continues to provide operational voltage both for the discharge circuit and any other circuitry it may be biasing. However, when the potential of the power FET gate drops below the selected potential, low current biasing circuitry reduces the operating voltage of the adaptive bias circuitry thereby turning off the adaptive bias circuitry and any other circuits it is biasing.

The foregoing and additional features and advantages of the present invention will be more fully understood and appreciated upon consideration of the following detailed description of the invention, which should be considered in conjunction with the accompanying drawings.

BRIEF DESCRIPTION OF THE DRAWINGS

The drawings illustrate a schematic diagram of an embodiment of an adaptive discharge circuit in accordance with the present invention.

DETAILED DESCRIPTION OF THE INVENTION

The drawing provides a schematic diagram of an embodiment of an adaptive gate discharge circuit 10 in accordance with the present invention. The illustrated circuit may be implemented in integrated circuit form using well known fabrication processes.

As shown in the drawing, an adaptive gate discharge circuit 10 is connected between a conventional gate charge circuit 12 and a conventional power FET 14. Power FET 14 is shown in the drawing as connected in a high side driver configuration in which the other side of load 16 is connected to ground. It will be understood by those skilled in the art that the concepts of the invention apply equally as well to gate discharge circuits utilized in low side driver configurations.

A control signal 13 provides on/off base drive to NPN input transistor Q23. The collector of transistor Q23 is connected to the positive supply V+, while its emitter is connected to ground via 20 Kohm resistor R12, 10X NPN transistor Q17, and 500 ohm resistor R18 which form part of an adaptive biasing network to be described in greater detail below.

A 2X NPN discharge drive transistor Q24 receives its base drive from the positive supply via a low current bias string that includes 1 Mohm resistor R9 and three diode-configured NPN transistors Q20, Q21 and Q22. This low current bias string draws a small amount of current (approx. 10 microamps) at all times.

Adaptive bias circuitry comprising 4X NPN transistor Q15, transistors Q16 and Q17, 10 Kohm resistor R11 and 500 ohm resistor R18, is connected between the above-described low current bias string and discharge drive transistor Q24.

Multiple collector 2X PNP current mirror transistor Q27 (with 25 Kohm base-emitter resistor R17) and multiple collector 6X PNP current mirror transistor Q31 (with 5 Kohm base-emitter resistor R16) are connected between the output of discharge drive transistor Q24 and the gate of power FET 14. The primary collector of current mirror transistor Q31 is connected to the source of power FET 14.

Having described the construction of the adaptive gate discharge circuit 10, its operation will now be described. In the following discussion, it is assumed that gate charge circuit 12 has turned the power FET 14 on and that the power FET 14 is now to be turned off.

While the power FET 14 is turned on, input transistor Q23 holds discharge drive transistor Q24 off. When the power FET 14 is to be turned off, transistor Q23 is turned off by control signal 13, allowing discharge drive transistor Q24 to turn on.

The low current bias string, consisting of resistor R9 and diodes Q20–Q22, biases both the base of transistor Q24 and the adaptive bias circuitry consisting of devices Q15–Q17 and resistors R11 and R18.

Transistor Q24 has two sources of current: transistor Q17 and resistor R12. That is, the current flowing in transistor Q24 is the sum of the $\Delta V_{BE}/R$ component flowing in transistor Q17 (10X emitter) and the $2V_{BE}/R$ component flowing in resistor R12 (20 Kohm). The current flowing in resistor R12 has a negative temperature coefficient which is balanced by the positive temperature coefficient of the current flowing through transistor Q17.

Current mirror transistors Q27 and Q31 multiply the collector current of discharge drive transistor Q24 by a factor of approximately 50 to decrease the discharge time.

As the gate voltage of the power FET 14 drops below 4 $V_{BE}$, discharge drive transistor Q24 enters saturation and draws all of the bias current available from resistor R9, pulling the base of transistor Q15 (4X emitter) down. When the gate of the power FET 14 is fully discharged, the base bias of cascode transistors Q15 and Q24 will be at 1 $V_{BE}$ plus a small voltage across resistor R12. This voltage is below the operating voltage for the adaptive bias circuitry, which is therefore completely turned off along with any other circuitry it had been biasing. Thus, the gate of the power FET 14 will be held near ground via 5 Kohm resistor R16 and 25 Kohm resistor R17 and saturated discharge drive transistor Q24.

When the power FET 14 is to be turned on again, input transistor Q23 turns back on in response to assertion of control signal 13, turning discharge drive transistor Q24 off and allowing the voltage at the bases of cascode transistors Q15 and Q24 to return to 3 $V_{BE}$ while the gate of the power FET 14 charges.

It should be understood that various alternatives to the embodiment of the invention described herein may be utilized in practicing the invention. It is intended that the following claims define the scope of the invention and that devices within the scope of these claims and their equivalents be covered thereby.

What is claimed is:

1. An adaptive gate discharge circuit for discharging the gate of a power FET transistor from its conduction potential, the adaptive gate discharge circuit comprising:
   (a) discharge driver circuitry responsive to a control signal for discharging the power FET gate from the conduction potential to below a selected potential;
   (b) adaptive bias circuitry for providing an operating signal to the discharge driver circuitry during discharge of the power FET gate, the operating signal being sufficient for operation of the discharge driver circuitry; and
   (c) low current biasing circuitry connected to the adaptive biasing circuitry and responsive to the discharge of the power FET gate to below the selected potential to reduce the operating voltage of the adaptive biasing circuitry thereby turning off the adaptive biasing circuitry.

2. An adaptive gate discharge circuit connected to the gate of a power FET for discharging the power FET gate from a conduction voltage to a discharge voltage, the adaptive gate discharge circuitry comprising:
   (a) discharge driver circuitry responsive to a control signal for discharging the power FET gate from the conduction voltage, the discharge driver circuitry comprising a discharge driver transistor having its emitter connected to ground via a first resistive element, its collector connected to the power FET gate via a collector current multiplier, and its base connected to receive an operating signal;
   (b) adaptive bias circuitry for providing the operating signal to the discharge driver circuitry during discharge of the power FET gate, the adaptive bias circuitry comprising a first NPN transistor having its collector connected to a charge supply, its base connected to the charge supply via a second resistive element and to the base of the discharge drive transistor, the emitter of the first NPN transistor connected to the base-collector junction of a second NPN transistor via a third resistive element, the emitter of the second NPN transistor connected to ground, and a third NPN transistor having its collector connected to the emitter of the discharge drive transistor, its base connected to the base of the second NPN transistor and its emitter connected to ground via a fourth resistive element; and
   (c) low current biasing circuitry responsive to discharge of the power FET gate to below the discharge voltage for turning off the adaptive bias circuitry, the low current biasing circuitry comprising diode means connected between the base of the discharge drive transistor and ground.

3. An adaptive gate discharge circuit as in claim 2 wherein the collector current multiplier comprises:
   (a) a first multiple collector PNP transistor having its emitter connected to the power FET gate and to its base via a fifth resistive element, its primary collector connected to the source of the power FET, and a secondary collector connected to its base; and
   (b) a second multiple collector PNP transistor having its emitter connected to the base-secondary collector junction of the first multiple collector PNP transistor and to its own base via a sixth resistive element, a secondary collector connected to its base, and its base-secondary collector junction connected to the collector of the discharge drive transistor.

4. An adaptive gate discharge circuit as in claim 2 wherein the diode means comprises a plurality of diode-connected NPN transistors.

* * * * *